(12) United States Patent
Ke

(10) Patent No.: US 8,848,349 B2
(45) Date of Patent: Sep. 30, 2014

(54) HOUSING, A FASTENING MEMBER THEREOF AND A DISPLAY DEVICE INCORPORATING THE HOUSING

(71) Applicant: Wistron Corporation, New Taipei (TW)

(72) Inventor: Ming-Shiang Ke, New Taipei (TW)

(73) Assignee: Wistron Corporation, New Taipei (TW)

( * ) Notice: Subject to any disclaimer, the term of this patent is extended or adjusted under 35 U.S.C. 154(b) by 224 days.

(21) Appl. No.: 13/659,452

(22) Filed: Oct. 24, 2012

(65) Prior Publication Data

US 2013/0258609 A1  Oct. 3, 2013

(30) Foreign Application Priority Data

Apr. 2, 2012  (TW) .............................. 101111703 A

(51) Int. Cl.
*H05K 5/00* (2006.01)
*H05K 7/00* (2006.01)

(52) U.S. Cl.
USPC ..................................... 361/679.01; 361/747

(58) Field of Classification Search
CPC ... G06F 1/1616; G06F 1/1656; G06F 1/1632; G06F 1/1626; H05K 1/144; H05K 7/142; Y02E 60/12
USPC .......... 361/681, 679.21, 679.22, 679.26, 758, 361/816, 747, 679.01
See application file for complete search history.

(56) References Cited

U.S. PATENT DOCUMENTS

| | | | | |
|---|---|---|---|---|
| 4,200,900 A * | 4/1980 | McGeorge | .................... | 361/803 |
| 4,938,703 A * | 7/1990 | Nakano | ............................ | 439/74 |
| 5,191,513 A * | 3/1993 | Sugiura et al. | ................ | 361/752 |
| 5,452,184 A * | 9/1995 | Scholder et al. | ............. | 361/799 |
| 5,963,432 A * | 10/1999 | Crowley | ........................ | 361/804 |
| 5,978,232 A * | 11/1999 | Jo | ................................. | 361/796 |
| 6,104,614 A * | 8/2000 | Chou et al. | .................... | 361/704 |
| 6,140,591 A * | 10/2000 | Osborne et al. | ........... | 174/138 E |
| 6,308,394 B1 * | 10/2001 | Boe | ................... | 29/450 |
| 6,404,646 B1 * | 6/2002 | Tsai et al. | ...................... | 361/758 |
| 6,560,124 B1 * | 5/2003 | Irie et al. | ........................ | 361/816 |
| 6,726,505 B2 * | 4/2004 | Cermak et al. | ................ | 439/567 |
| 6,813,159 B2 * | 11/2004 | Irie et al. | ........................ | 361/752 |
| 6,955,554 B2 * | 10/2005 | Korsunsky et al. | ............ | 439/328 |
| 6,964,581 B2 * | 11/2005 | Chen et al. | .................... | 439/547 |
| 6,985,367 B1 * | 1/2006 | Scigiel | .......................... | 361/801 |
| 6,995,982 B2 * | 2/2006 | Gonzalez et al. | ............. | 361/758 |
| 7,052,291 B2 * | 5/2006 | Barina et al. | ..................... | 439/92 |
| 7,085,141 B2 * | 8/2006 | Yi | ................................. | 361/804 |
| 7,220,142 B2 * | 5/2007 | Liang | ............................ | 439/326 |
| 7,259,958 B2 * | 8/2007 | Bang et al. | ............... | 361/679.27 |

(Continued)

*Primary Examiner* — Hoa C Nguyen
*Assistant Examiner* — Xanthia C Cunningham
(74) *Attorney, Agent, or Firm* — Shook Hardy & Bacon LLP

(57) ABSTRACT

A housing includes a rear housing segment including a protruding post, a back plate disposed in front of the rear housing segment and including a protrusion, and a fastening member disposed between the rear housing segment and the back plate, and including a positioning cap, a positioning post, and an engaging hook. The positioning cap covers removably the protrusion. The positioning post protrudes from the positioning cap opposite to the protrusion and engages the protruding post. The engaging hook includes a clamping plate that cooperates with the positioning cap to clamp the board member therebetween, and an engaging block that removably engages an engaging hole in the board member.

20 Claims, 13 Drawing Sheets

(56) References Cited

U.S. PATENT DOCUMENTS

| | | | |
|---|---|---|---|
| 7,300,299 B2* | 11/2007 | Wang | 439/326 |
| 7,701,699 B2* | 4/2010 | Ma | 361/679.21 |
| 8,552,298 B2* | 10/2013 | Liu et al. | 174/138 E |
| 2005/0047100 A1* | 3/2005 | Kim | 361/758 |
| 2006/0044745 A1* | 3/2006 | Kim | 361/681 |
| 2007/0064404 A1* | 3/2007 | Dean | 361/810 |
| 2009/0080171 A1* | 3/2009 | Peng | 361/807 |
| 2010/0246111 A1* | 9/2010 | Yokota et al. | 361/679.01 |
| 2011/0141694 A1* | 6/2011 | Kamiguchi | 361/704 |
| 2012/0308866 A1* | 12/2012 | Nishida et al. | 429/100 |

\* cited by examiner

US 8,848,349 B2

HOUSING, A FASTENING MEMBER THEREOF AND A DISPLAY DEVICE INCORPORATING THE HOUSING

CROSS-REFERENCE TO RELATED APPLICATION

This application claims priority of Taiwanese Patent Application No. 101111703, filed on Apr. 2, 2012, the disclosure of which is incorporated herein by reference.

BACKGROUND OF THE INVENTION

The present invention relates to a housing, and more particularly to a housing and a fastening member thereof for fixing a board member, and a display device incorporating the housing.

A conventional display device such as an LCD display device or an LCD TV is generally provided with a circuit board that is disposed between a casing thereof and a back plate of a display screen thereof. Usually, the circuit board is directly fastened to the casing or the back plate by a screw fastener. However, during the screw-fastening process, the surface of the circuit board may be damaged due to an excessive screwing force. Furthermore, since the casing or the back plate lacks a structural design for positioning the circuit board, prior to screwing in the screw fastener, the assembly personnel has to manually align a through hole in the circuit board and a screw hole in the casing or the back plate, making the assembly process inconvenient and time-consuming.

SUMMARY OF THE INVENTION

Therefore, an object of the present invention is to provide a housing, in which a fastening member is provided to secure a board member between a back plate and a rear housing segment of the housing in a quick and convenient way, thereby improving efficiency in assembling the housing to the board member and reducing man hour required for the assembly.

Another object of the present invention is to provide a housing, in which the fastening member may be fastened to the board member in an engaging and clamping manner without adversely affecting or positioning cap covers removably the protrusion, and damaging the surface of the board member.

Accordingly, one aspect of the present invention provides a housing for securing a board member that is formed with an engaging hole. The housing includes a rear housing segment, a back plate and a fastening member. The rear housing segment includes a front surface and a protruding post that protrudes from the front surface. The back plate is disposed in front of the rear housing segment, is spaced apart from the front surface of the rear housing segment, and includes a protrusion. The fastening member is disposed between the rear housing segment and the back plate, and includes a positioning cap, a positioning post, and an engaging hook. The positioning cap covers removably the protrusion, and has an outer surface opposite to the protrusion. The positioning post protrudes from the outer surface of the positioning cap and is engaged with the protruding post of the rear housing segment. The engaging hook includes a clamping plate that protrudes from the positioning post and that is spaced from the outer surface of the positioning cap, and an engaging block that protrudes from the clamping plate towards the outer surface of the positioning cap. The clamping plate and the positioning cap are operable to cooperatively clamp the board member there between. The engaging block is operable to removably engage in the engaging hole in the board member.

According to another aspect of the present invention, there is provided a display device that includes the above mentioned board member and the above mentioned housing. Based on the above technical means, the display device with the housing structure of the present invention has the following advantages and effects. The fastening member is provided to secure the board member between the back plate and the rear housing segment in a quick and convenient way, thereby improving the assembling efficiency and reducing the man hour, and without adversely affecting or damaging the surface of the board member.

BRIEF DESCRIPTION OF THE DRAWINGS

Other features and advantages of the present invention will become apparent in the following detailed description of one embodiment with reference to the accompanying drawings, of which.

DETAILED DESCRIPTION OF THE PREFERRED EMBODIMENT

The above-mentioned and other technical contents, features, and effects of this invention will be clearly presented from the following detailed description of the embodiment in coordination with the reference drawings. The technical means for achieving the objects of the present invention and the effects thereof may be further comprehended through the description of the embodiment. However, the accompanying drawings are illustrated for reference only and should not be regarded as the limitations to the scope of the present invention.

Figure 1:
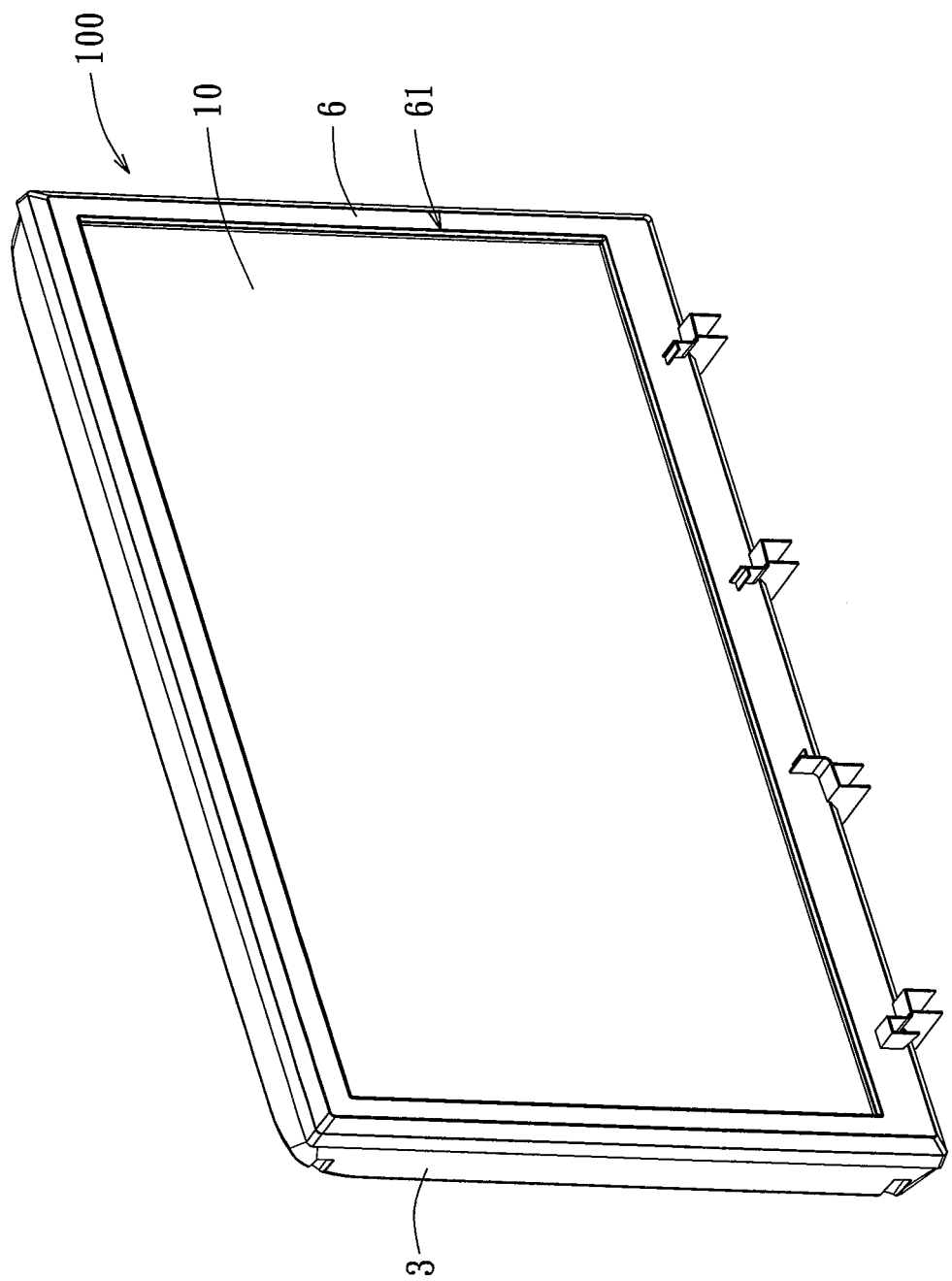
FIG. 1 is a schematic view of a display device according to an embodiment of the present invention.
Figure 2:
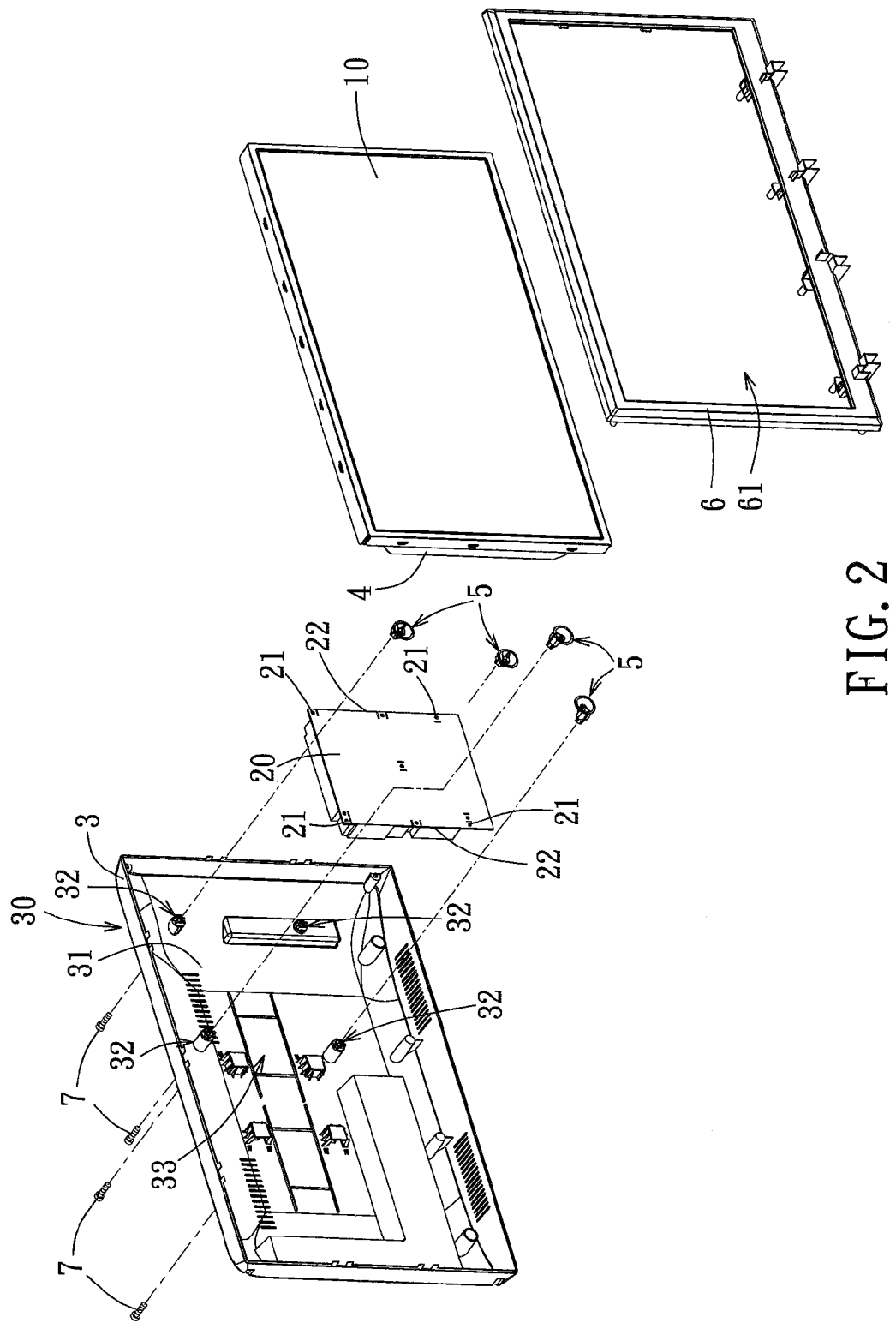
FIG. 2 is an exploded perspective view of the display device, illustrating assembly relationships among a board member, a rear housing segment, a back plate, and a plurality of fastening members.
Figure 3:
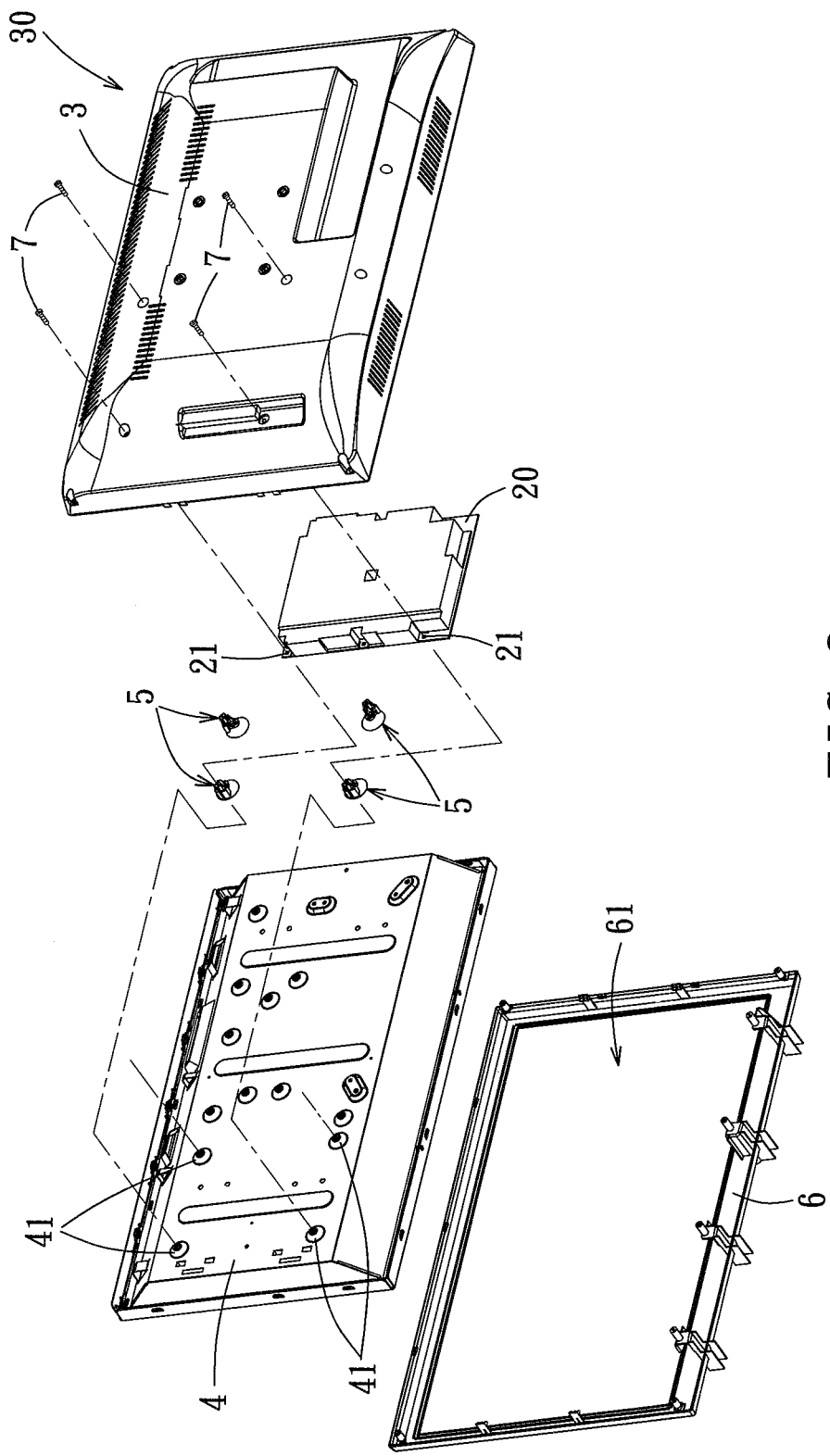
FIG. 3 is another exploded perspective view of the display device from a different angle, illustrating the assembly relationships among the board member, the rear housing segment, the back plate, and the fastening members.

FIGS. 1 and 2 show a display device 100 having a housing according to an embodiment of the present invention. The display device 100 may be a liquid crystal display (LCD) device or an LCD television. The display device 100 includes a display module 10, a board member 20 and a housing 30. The board member 20 of this embodiment is exemplified as a circuit board, and may alternatively be another component to be mounted and secured.

As shown in FIGS. 2, 3, 4 and 5, the board member 20 is formed with a plurality of engaging holes 21. The housing 30 includes a rear housing segment 3, a back plate 4 and a plurality of fastening members 5. The rear housing segment 3 includes a front surface 31 and a plurality of protruding posts 32 protruding from the front surface 31. The back plate 4 is mounted at the rear of the display module 10, is disposed in front of the rear housing segment 3, and is spaced apart from the front surface 31. The back plate 4 includes a plurality of protrusions 41. The fastening members 5 are disposed between the rear housing segment 3 and the back plate 4, and each of the fastening members 5 includes a positioning cap 51, a positioning post 52, and an engaging hook 53. The positioning cap 51 of each of the fastening members 5 covers a corresponding one of the protrusions 41. The positioning post 52 of each of the fastening members 5 protrudes from an outer surface of the positioning cap 51 opposite to the corresponding one of the protrusions 41, and is engaged with a corresponding one of the protruding posts 32. The engaging hook 53 includes a clamping plate 531 protruding from the positioning post 52 and spaced apart from the outer surface of the positioning cap 51, and an engaging block 532 protruding from the clamping plate 531 towards the outer surface of the positioning cap 51. The board member 20 is removably clamped by the clamping plate 531 and the positioning cap 51 cooperatively, and the engaging block 532 is removably engaged in a corresponding one of the engaging holes 21 in the board member 20, so as to secure the relative positions of the board member 20 and each of the fastening members 5. With the provision of the fastening members 5, the board member 20 can be mounted and secured between the back plate 4 and the rear housing segment 3 in a quick and convenient way, thus improving assembling efficiency and reducing man hour. Moreover, the fastening members 5 are fastened to the board member in an engaging and clamping manner, which does not damage the surface of the board member 20.

The detailed structure of the housing 30 and the assembly method for assembling the board member 20, the back plate 4 and the rear housing segment 3 will be described in detail below.

Figure 4:
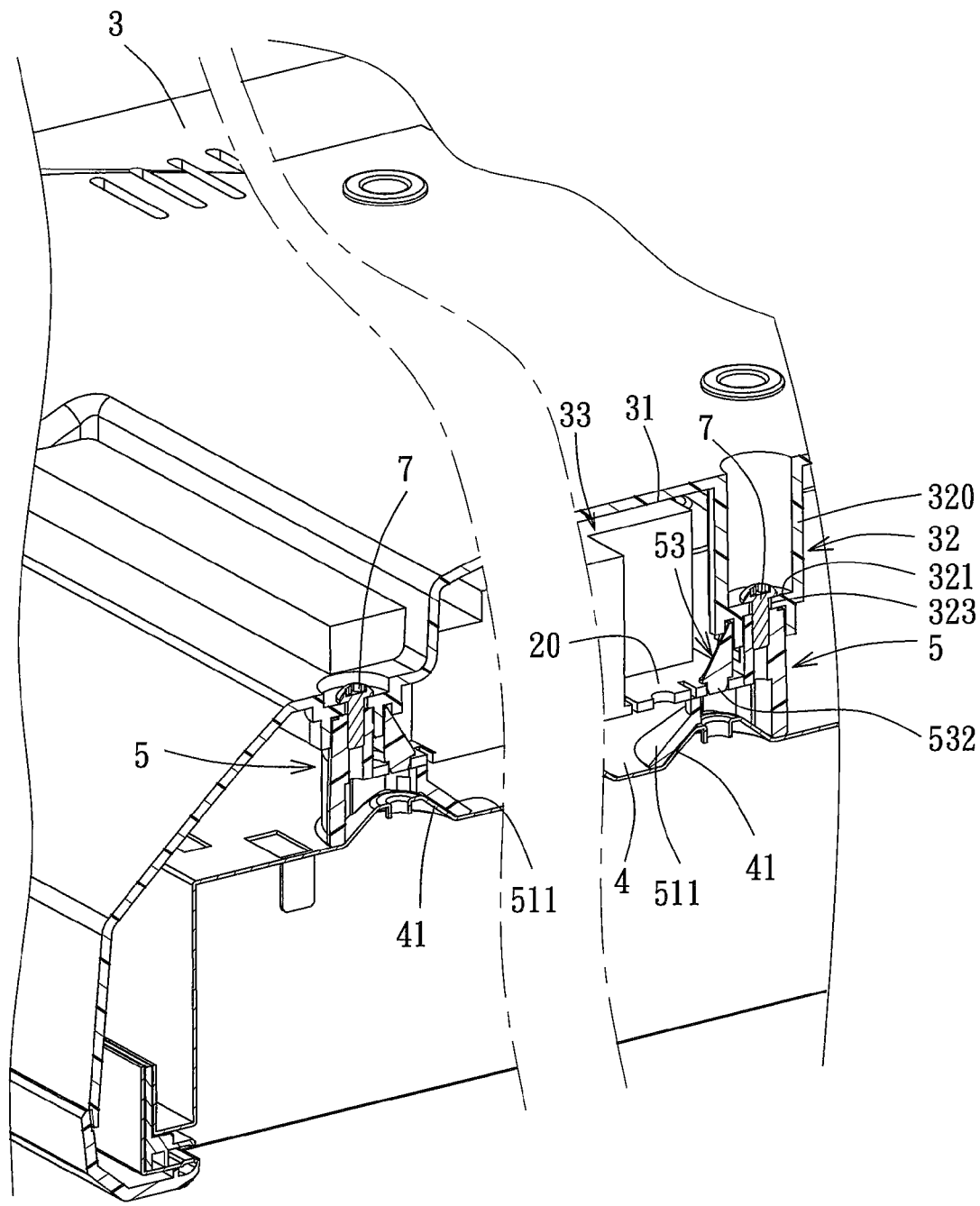
FIG. 4 is a schematic sectional view of the display device.

As shown in FIGS. 2 and 4, the rear housing segment 3 defines a receiving space 33, and the display module 10, the board member 20 and the back plate 4 are all disposed in the receiving space 33 of the rear housing segment 3. The housing 30 further includes a front housing segment 6 mounted in front of the rear housing segment 3. The front housing segment 6 is a frame and defines an opening 61. The display module 10 is located between the front housing segment 6 and the back plate 4 and is exposed from the opening 61.

Figure 6:
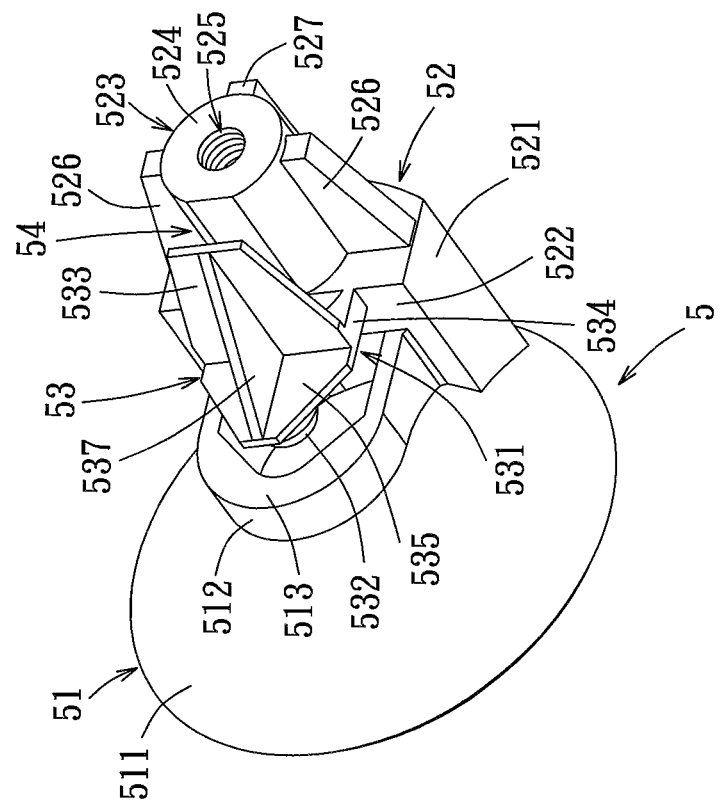
FIG. 6 is another perspective view of the fastening member.
Figure 5:
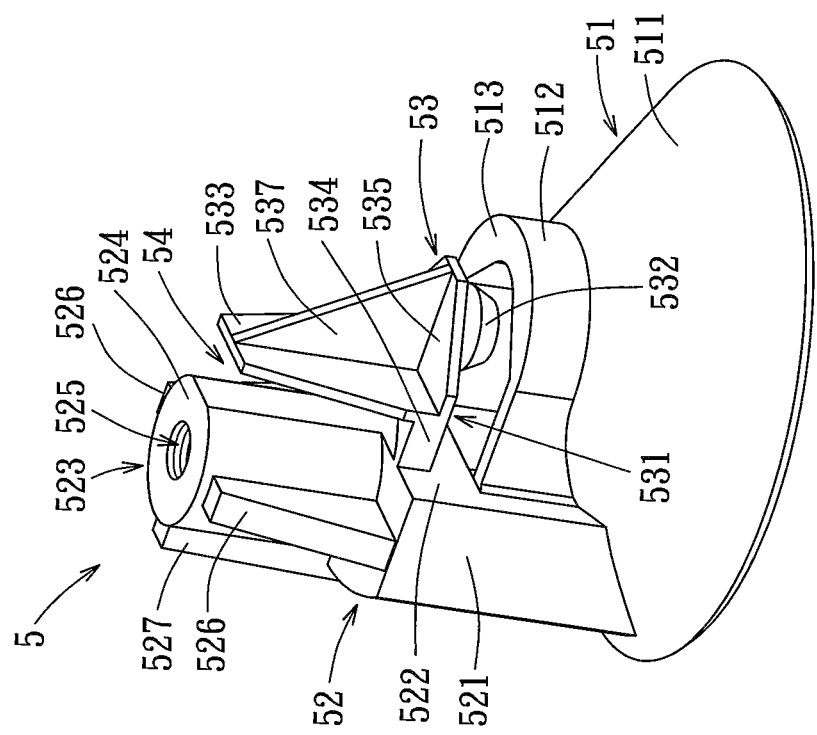
FIG. 5 is a perspective view of the fastening member, illustrating a positioning cap, a positioning post and an engaging hook thereof.

As shown in FIGS. 4, 5 and 6, to improve the convenience in the assembly and disassembly of the fastening members 5 and the board member 20, the engaging hook 53 further includes a pulling plate 533 protruding from one side of the clamping plate 531 opposite to the engaging block 532. The pulling plate 533 is spaced apart from the positioning post 52 so as to provide a space for a free end of the pulling plate 533 distal from the clamping plate 531 to move towards the positioning post 52 when the free end is pulled. During assembly, the pulling plate 533 is pulled to bring the clamping plate 531 to move towards the positioning post 52 so that the engaging block 532 is moved away from the positioning cap 51 out of the path for inserting the board member 20, thereby enabling the fastening member 5 to be pushed towards the board member 20 in a quick and convenient way so that the board member 20 is disposed between the clamping plate 531 and the positioning cap 51. Next, once the pulling plate 533 is released to bring the engaging hook 53 back to a normal position, the clamping plate 531 and the positioning cap 51 cooperate to clamp the board member 20, and the engaging block 532 is engaged in the corresponding one of the engaging holes 21 in the board member 20. During disassembly, the pulling plate 533 is pulled to bring the clamping plate 531 to move towards the positioning post 52 such that the engaging block 532 is disengaged from the corresponding one of the engaging holes 21, thereby enabling the fastening member 5 to be removed from the board member 20. The provision of the pulling plate 533 provides a structure where a force can be conveniently applied to move the clamping plate 531, thereby effectively improving the convenience during assembly and disassembly of the fastening members 5 and the board member 20.

In addition, each of the protrusions 41 of the back plate 4 may be conical in shape, and the positioning cap 51 of each of the fastening members 5 may include a cap body 511 having the outer surface. The cap body 511 has a shape matched with that of the corresponding one of the protrusions 41 and is slightly greater than the latter in size. By covering the cap body 511 on the corresponding one of the protrusions 41, the positioning cap 51 can be positioned on the back plate 4 without displacing relative the back plate 4. In this embodiment, each of the protrusions 41 and the cap body 511 of each of the fastening members 5 are truncated-cone-shaped. Alternately, the protrusions 41 and the cap bodies 511 may be pyramid-shaped or any other matching shapes.

The positioning cap 51 further includes an abutting protrusion 512 protruding from the outer surface of the cap body 511 towards the clamping plate 531. The abutting protrusion 512 has an abutting surface 513 parallel to and spaced from the clamping plate 531. The abutting surface 513 is provided for the board member 20 to abut there against. The design of the abutting surface 513 ensures the contact relation between the abutting protrusion 512 and the board member 20, so that the board member 20 is securely clamped between the abutting surface 513 of the abutting protrusion 512 and the clamping plate 531 of the engaging hook 53, thereby ensuring that the engagement of the engaging block 532 in the corresponding one of the engaging holes 21 in the board member 20 is maintained to keep the board member 20 securely positioned, and prevent the engaging block 532 from disengaging from the corresponding one of the engaging holes 21 due to shaking of the board member 20.

Furthermore, the positioning post 52 includes a stop column 521 protruding from the outer surface of the cap body 511 of the positioning cap 51. The stop column 521 has a stop surface 522. The clamping plate 531 and the abutting protrusion 512 are separately connected to the stop surface 522, and the stop surface 522 is configured for a side surface 22 (as shown in FIG. 2) of the board member 20 to abut there against. When each of the fastening members 5 is pushed towards the board member 20 to insert the board member 20 between the clamping plate 531 and the abutting protrusion 512 of the positioning cap 51, the side surface 22 of the board member 20 is stopped at to abut against the stop surface 522, thereby confining a moving distance of the fastening member 5 relative to the board member 20. As such, the efficiency of aligning the engaging block 532 of each of the fastening members 5 and the corresponding one of the engaging holes 21 of the board member 20 is effectively improved, thereby facilitating fast engagement of the engaging block 532 in the corresponding one of the engaging holes 21 during assembly.

Figure 8:
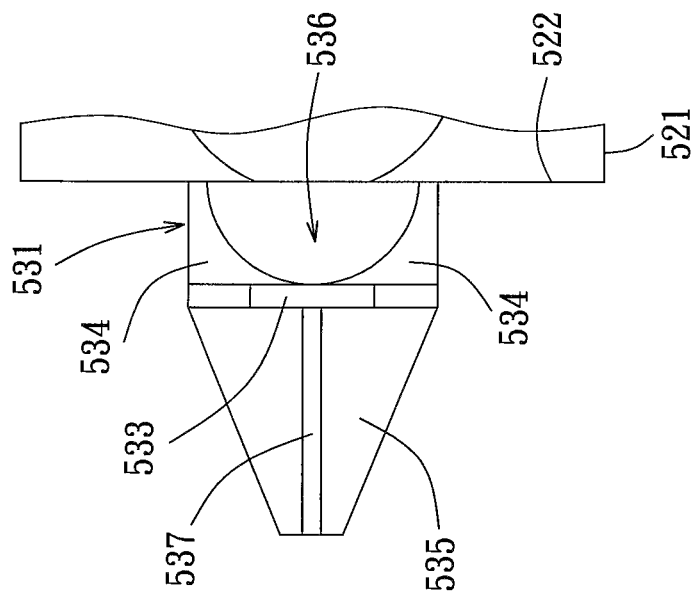
FIG. 8 is a fragmentary enlarged top view of the fastening member, illustrating that a through slot is formed between two thick plate portions of a clamping plate of the engaging hook.
Figure 7:
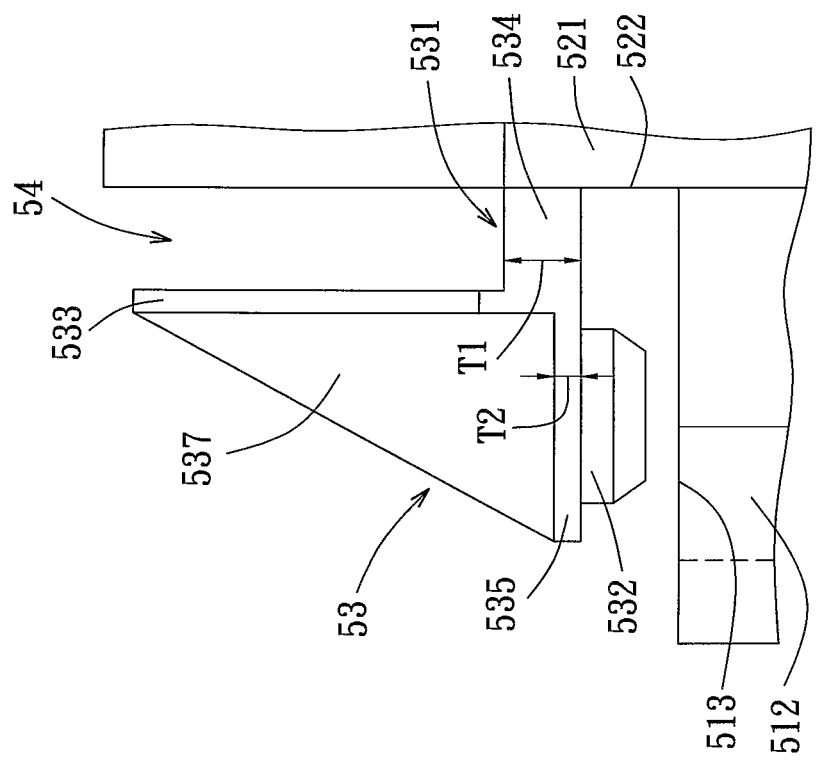
FIG. 7 is a fragmentary enlarged side view of the fastening member.

As shown in FIGS. 5, 7 and 8, to enhance the strength of the clamping plate 531 to prevent it from breaking in the pulling process, in this embodiment, the clamping plate 531 includes two thick plate portions 534 connected to the stop surface 522 and spaced from each other, and a thin plate portion 535 connected to ends of the two thick plate portions 534 opposite to the stop surface 522. Each of the thick plate portions 534 has a thickness (T1) greater than a thickness (T2) of the thin plate portion 535. The pulling plate 533 is perpendicularly connected at a junction of the two thick plate portions 534 and the thin plate portion 535. A semicircular through slot 536 (as shown in FIG. 8) is formed between the two thick plate portions 534. By means of the greater thickness (T1) of each of the thick plate portions 534, the strength of connection between the clamping plate 531 and the stop surface 522 is improved so as to prevent the engaging hook 53 from breaking at the junction of the clamping plate 531 and the stop surface 522 when the pulling plate 533 is pulled to move towards the positioning post 52. Through the design in which the pulling plate 533 is perpendicularly connected at the junction of the two thick plate portions 534 and the thin plate portion 535, the strength of connection between the pulling plate 533 and the clamping plate 531 is improved. Moreover, the design of the through slot 536 formed between the two thick plate portions 534 provides a space to accommodate the bending and deformation of the thick plate portions 534 when the clamping plate 531 is brought by the pulling plate 533 to move towards the positioning post 52.

More specifically, the engaging hook 53 further includes a reinforcement plate 537 connected between the pulling plate 533 and the thin plate portion 535 of the clamping plate 531. The reinforcement plate 537 is triangular in shape and is for enhancing the strength of connection between the pulling plate 533 and the thin plate portion 535, so as to facilitate the pulling plate 533 in bringing the thin plate portion 535 and the engaging block 532 to move away from the abutting protrusion 512 when pulled.

Figure 9:
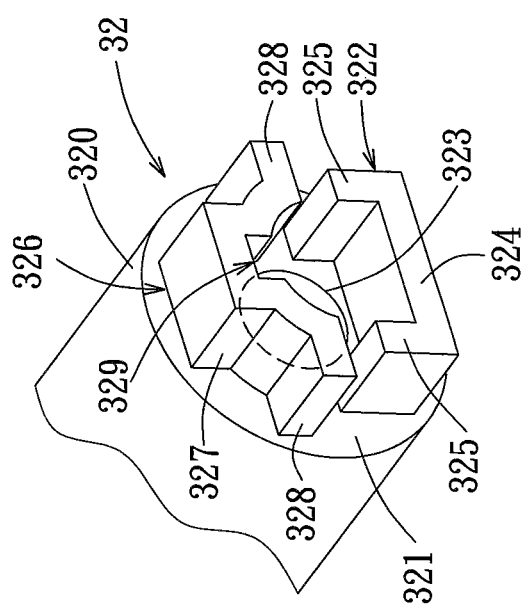
FIG. 9 is a fragmentary enlarged view of a protruding post of the rear housing segment.

FIG. 9 is a partial enlarged view of one of the protruding posts 32. As shown in FIGS. 4, 5 and 9, the positioning post 52 of each of the fastening members 5 further includes a coupling column 523 protruding from one end of the stop column 521 distal from the positioning cap 51, and an engaging passage 54 is formed between the pulling plate 533 and the coupling column 523. Each of the protruding posts 32 includes a hollow tube 320 in spatial communication with the external environment and protruding forwardly from the front surface 31 of the rear housing segment 3, an end wall 321 disposed at an opening in the front of the hollow tube 320, and a first stop block 322 protruding forwardly from a front wall surface of the end wall 321. The first stop block 322 of each of the protruding posts 32 is configured to be engaged in the engaging passage 54 of the corresponding one of the fastening members 5, so as to separate the pulling plate 533 and the coupling column 523 of the corresponding one of the fastening members 5 from each other and to prevent the pulling plate 533 from approaching towards the coupling column 523, thereby ensuring secure engagement of the engaging block 532 of the engaging hook 53 in the corresponding one of the engaging holes 21 of the board member 20. Moreover, the first stop block 322 further restricts rotation of the corresponding one of the fastening members 5 relative to the corresponding one of the protruding posts 32 of the rear housing segment 3 and the corresponding one of the protrusions 41 of the back plate 4.

As shown in FIGS. 2, 5 and 9, the end wall 321 of each of the protruding posts 32 is formed with a through hole 323 (as shown in FIG. 4) in spatial communication with the external environment, and the coupling column 523 of each of the fastening members 5 includes a locking column portion 524. The locking column portion 524 is formed with a screw hole 525 corresponding in position to the through hole 323 in the corresponding one of the protruding posts 32. The housing 30 further includes a plurality of screw fasteners 7. Each of the screw fasteners 7 is configured to extend through the through hole 323 in the corresponding one of the protruding posts 32 and be threadedly engaged with the screw hole 525 of the corresponding one of the fastening members 5, so as to fasten the corresponding one of the fastening members 5 to the corresponding one of the protruding posts 32. It should be noted that since the first stop block 322 of each of the protruding posts 32 is engaged in the engaging passage 54 of the corresponding one of the fastening members 5, to restrict the rotation of the fastening member 5, the screw fasteners 7 may be smoothly and respectively screwed in the screw holes 525 with a tool such as a screw driver (not shown).

To improve the effect the protruding posts 32 in restricting the rotation of the fastening members 5 by, in this embodiment, the coupling column 523 further includes two first side ribs 526 protruding from an outer surface of the lock column portion 524 and located on two opposite sides relative to the screw hole 525. The first stop block 322 is generally U-shaped and includes a partition portion 324 configured to be engaged in the engaging passage 54, and two first side portions 325 respectively disposed on two opposite ends of the partition portion 324. The two first side portions 325 respectively abut against sides of the two first side ribs 526 facing the pulling plate 533 so as to resist the rotating force directly delivered to the first side ribs 526 during screwing rotation of the corresponding one of the screw fasteners 7, thereby restricting the rotation of the first side ribs 526, and in turn improving the effect of the protruding post 32 in restricting the rotation of the fastening member 5.

Furthermore, each of the protruding posts 32 further includes a second stop block 326 protruding forwardly from the front wall surface of the end wall 321 and spaced apart from the first stop block 322. The second stop block 326 includes a surrounding portion 327 configured to surround an outer periphery of the coupling column 523, and two second side portions 328 respectively disposed on two opposite ends of the surrounding portion 327. The surrounding portion 327 is formed with a groove 329, and the coupling column 523 further includes a second side rib 527 protruding from the outer surface of the locking column portion 524 and engaged in the groove 329. The two second side portions 328 respectively abut against sides of the two first side ribs 526 opposite to the pulling plate 533. The second side portions 328 and the surrounding portion 327 can respectively resist the rotating force directly delivered to the first side ribs 526 and the second side rib 527 during screwing rotation of the corresponding one of the screw fasteners 7, thereby restricting the rotation of the first side ribs 526 and the second side rib 527. The first stop block 322 and the second stop block 326 cooperate to confine the coupling column 523, so that the protruding post 32 can effectively prevent the relative rotation of the corresponding one of the fastening members 5.

Figure 10:
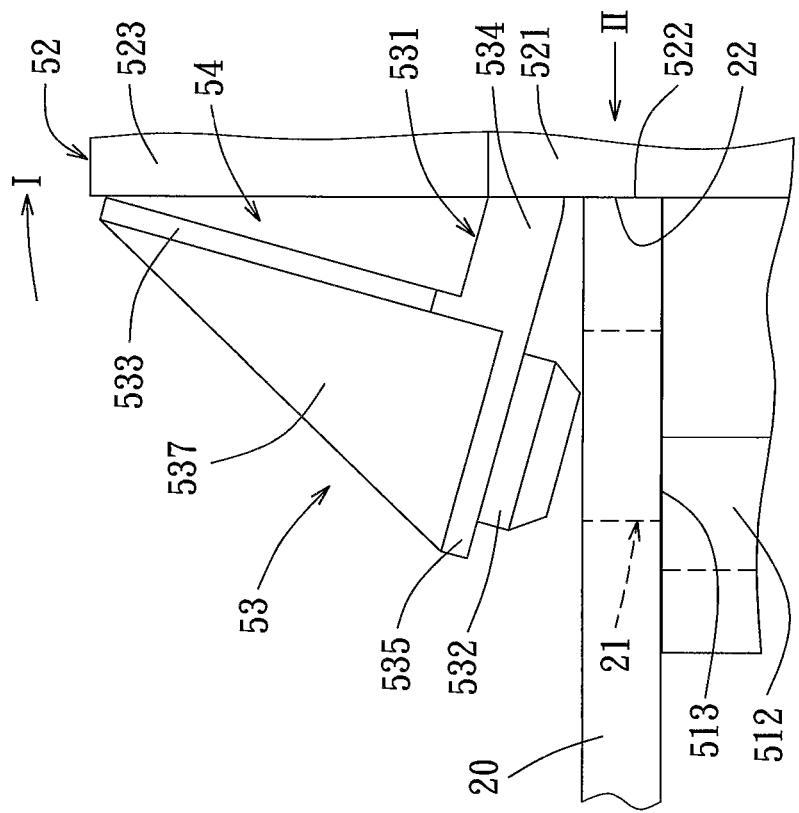
FIG. 10 is a schematic view, illustrating a process of assembling the fastening member to the board member.
Figure 11:
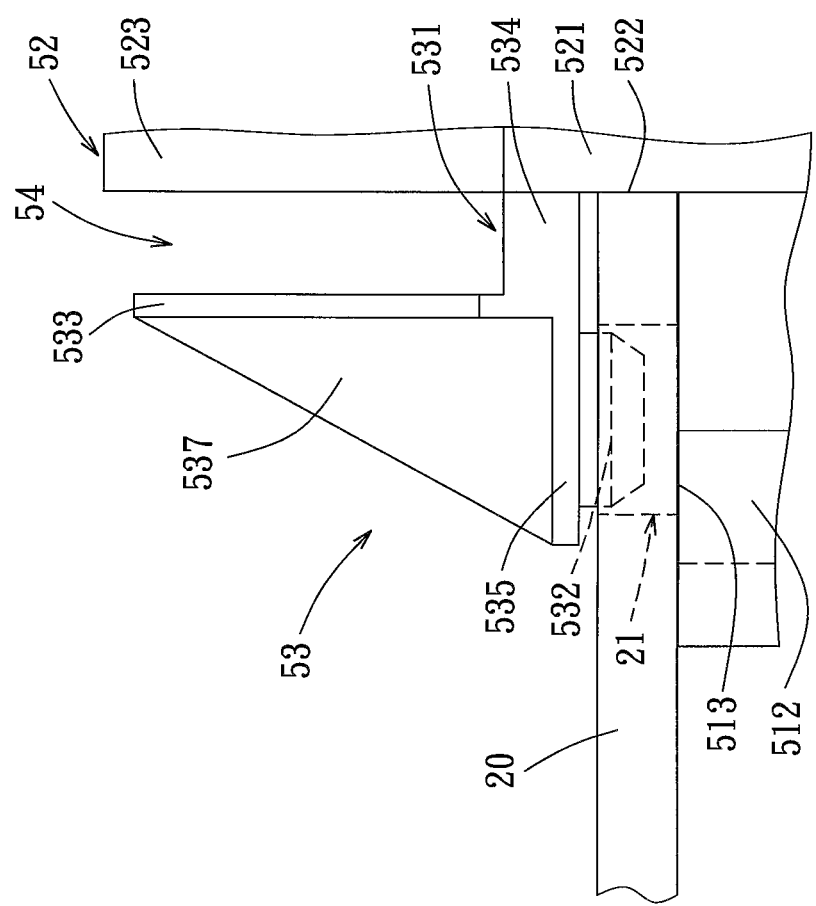
FIG. 11 is a schematic view, illustrating completion of the process of assembling the fastening member to the board member.

As shown in FIGS. 4, 10 and 11, when it is desired to mount and secure the board member 20 between the back plate 4 and the rear housing segment 3, firstly, the fastening members 5 are each coupled to the board member 20. To do this, first, the pulling plate 533 of the engaging hook 53 of each of the fastening members 5 is pulled in a direction indicated by an arrow (I) to bring the free end of the pulling plate 533 towards the coupling column 523 of the positioning post 52, to deform and bend two thick plate portions 534 to accumulate an elastic restoring force therein, and to bring the thin plate portion 535 and the engaging block 532 to move towards the coupling column 523 and away from the abutting protrusion 512. Next, the fastening member 5 is pushed in a direction indicated by an arrow (II) towards the board member 20, or the board member 20 is pushed in a direction opposite to that indicated by the arrow (II) towards the fastening member 5, so that the board member 20 is inserted between the clamping plate 531 and the abutting protrusion 512. When the stop surface 522 of the stop column 521 abuts against the side surface 22 of the board member 20, the fastening member 5 can no longer be moved further relative to the board member 20 in the direction indicated by the arrow (II). Then, after aligning the engaging block 532 and the corresponding one of the engaging holes 21 in the board member 20, the pulling plate 533 is released. By virtue of the elastic restoring force accumulated in the thick plate portions 534, the elastic hook 53 is returned to the normal position as shown in FIG. 11, such that the engaging block 532 of the engaging hook 53 is engaged in the corresponding one of the engaging holes 21 in the board member 20, and such that the clamping plate 531 and the abutting protrusion 512 cooperate to clamp the board member 20 there between.

Figure 12:
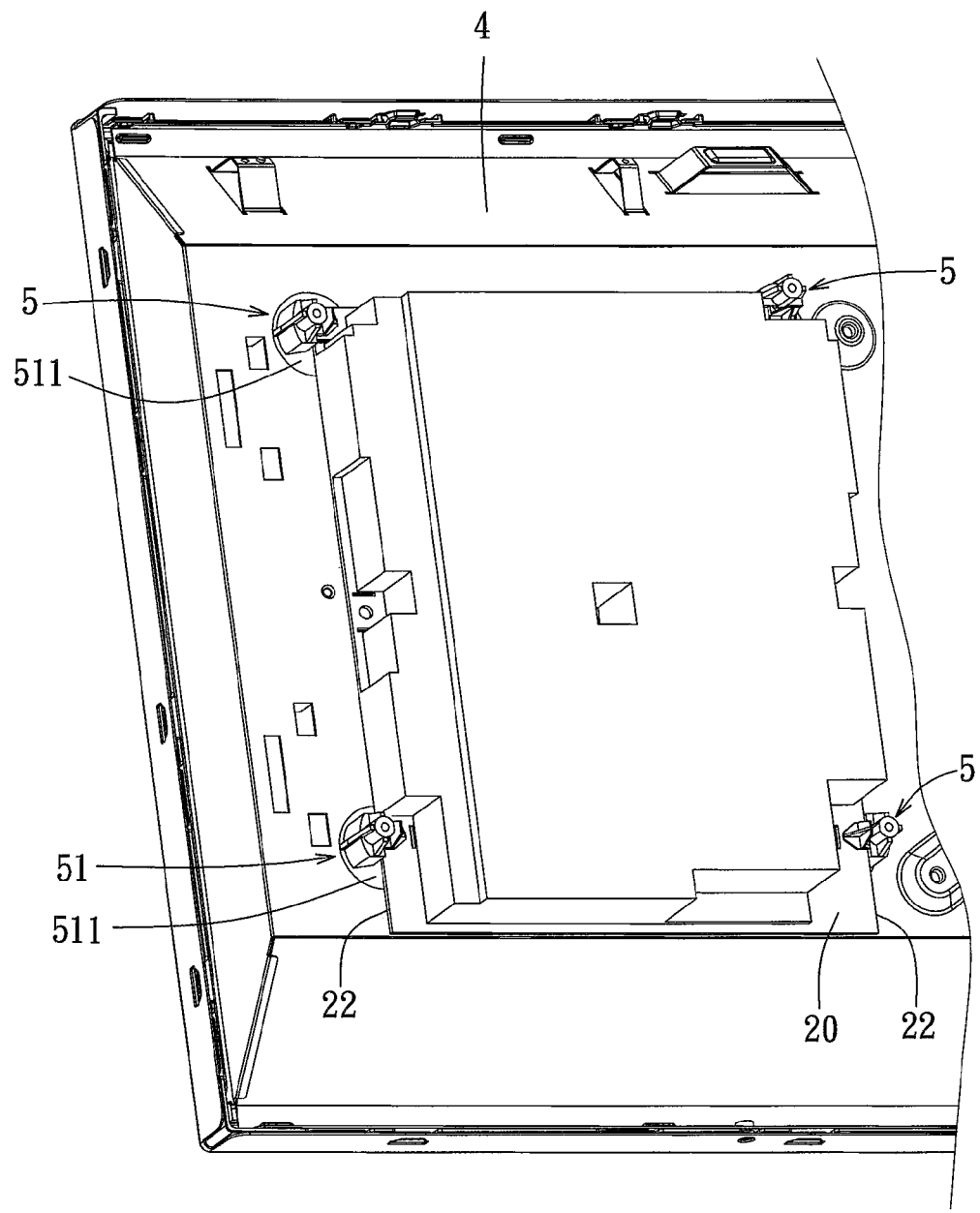
FIG. 12 is a fragmentary schematic view of the display device, illustrating a cap body of the fastening member covering a protrusion of the back plate.
Figure 13:
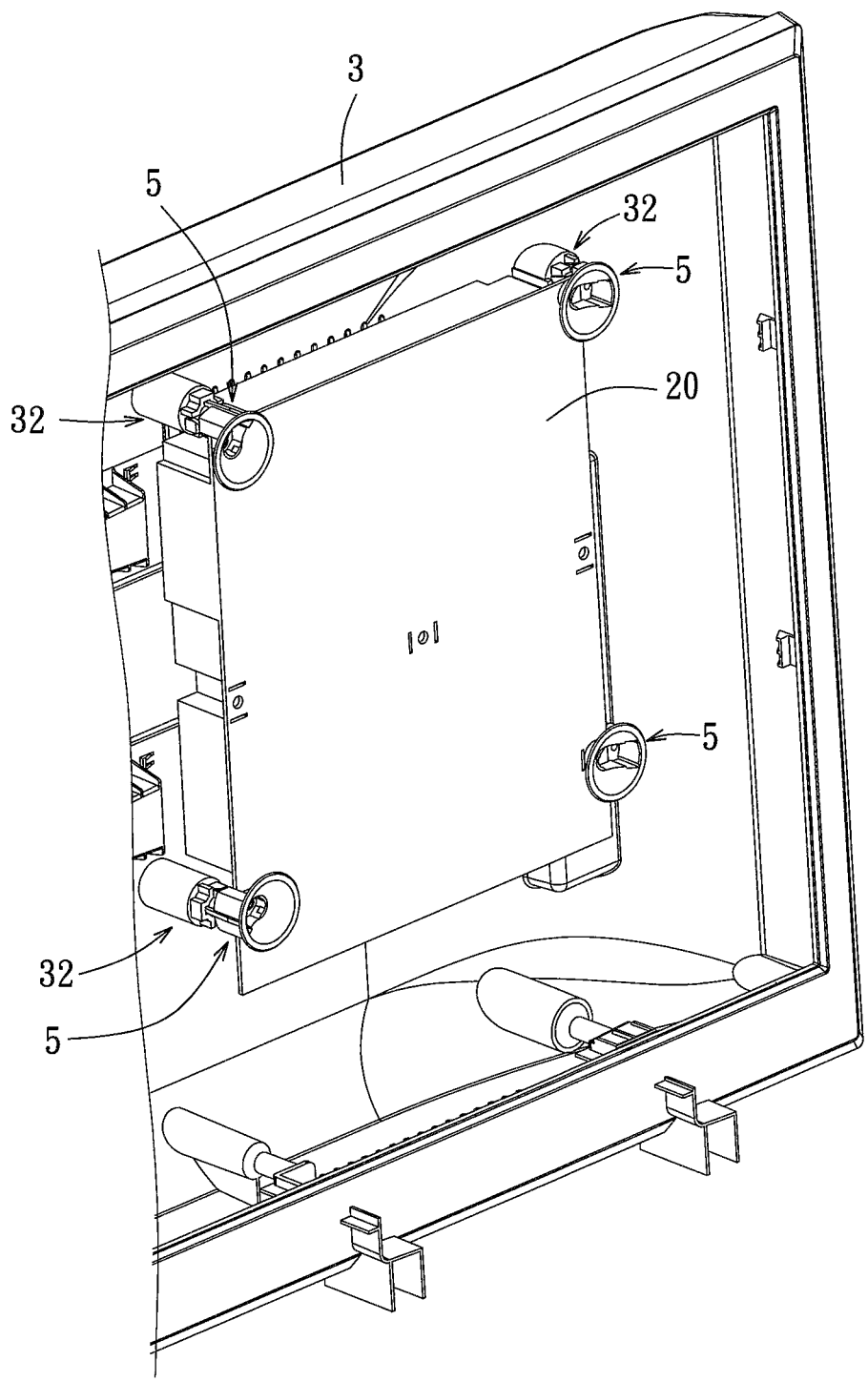
FIG. 13 is a fragmentary schematic view of the display device, illustrating that the rear housing segment is covered on the back plate, and that protruding posts of the rear housing segment are engaged with coupling columns of the fastening members, in which the back plate is omitted.
Figure 14:
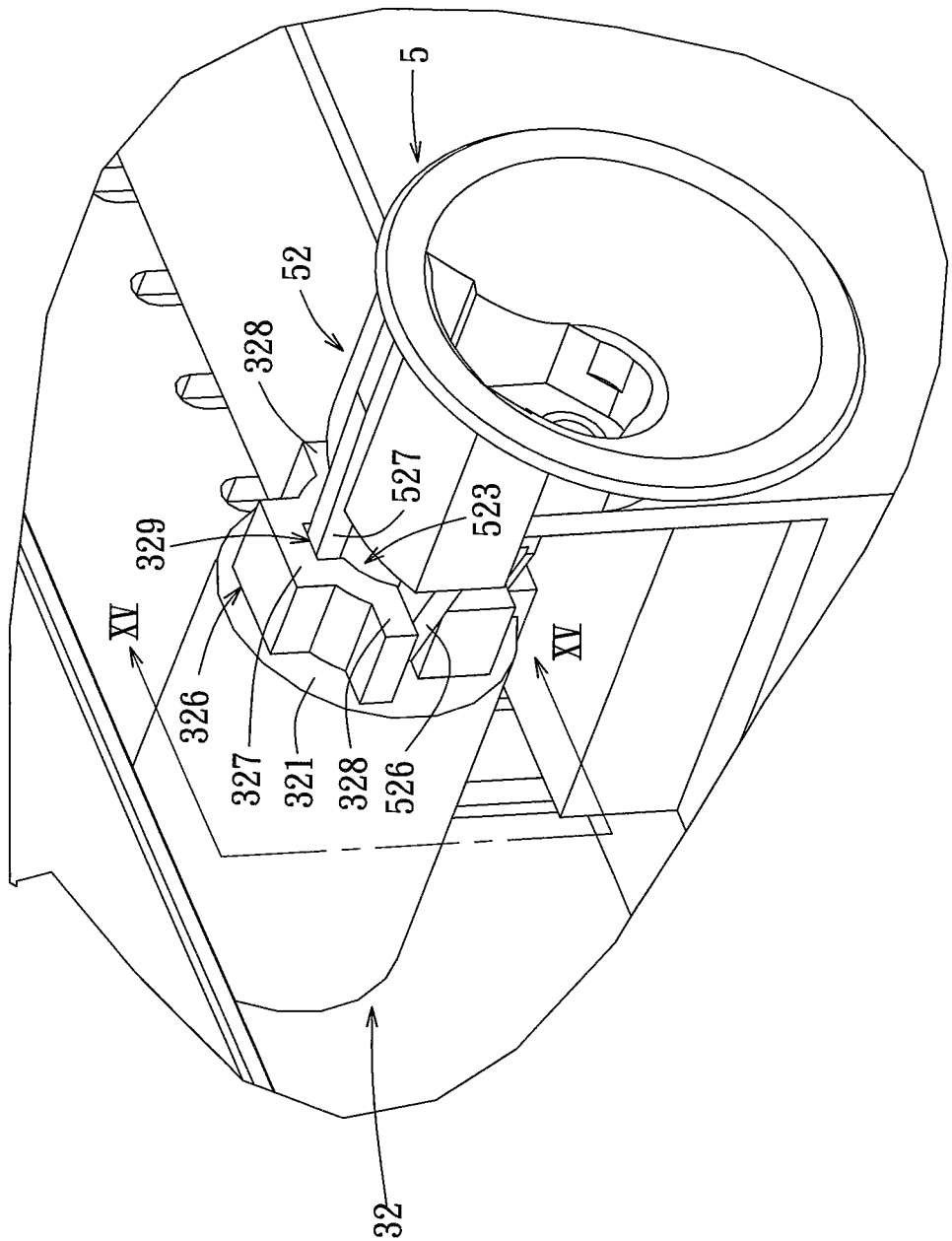
FIG. 14 is a partial enlarged view of FIG. 13.
Figure 15:
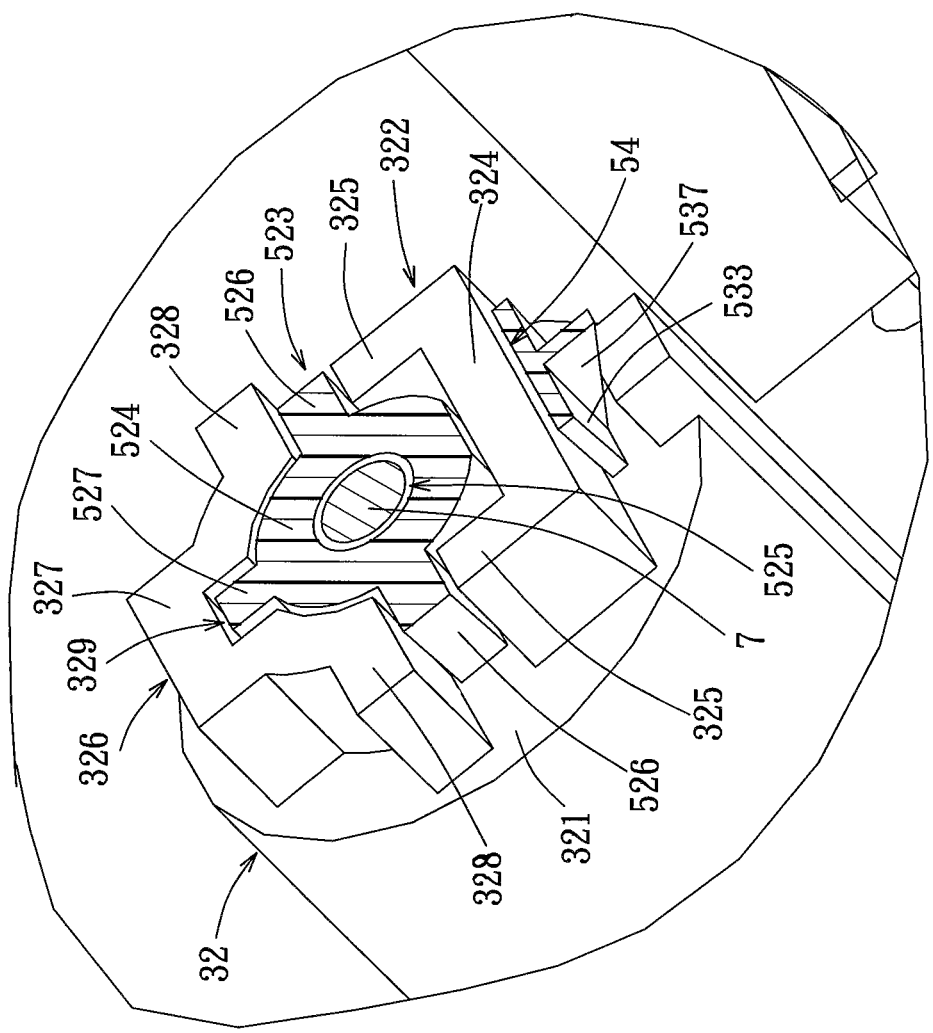
FIG. 15 is a sectional view taken along line XV-XV in FIG. 14.

As shown in FIGS. 4 and 12, after the plurality of the fastening members 5 are coupled to the board member 20 (as shown in FIG. 11) with the engaging blocks 532 of the fastening members 5 respectively engaged in the engaging holes 21 and with the stop surfaces 522 of the fastening members 5 respectively abutting against the side surfaces 22 (shown in FIG. 2) of the board member 20, the positioning cap 51 of each of the fastening members 5 is aligned with the corresponding one of the protrusions 41 of the back plate 4, and then the cap body 511 of the positioning cap 51 is brought to cover the corresponding one of the protrusions 41 so that the fastening members 5 and the board member 20 are positioned on the back plate 4.

As shown in FIGS. 13, 14, 15 and 16, subsequently, after aligning the plurality of the protruding posts 32 of the rear housing segment 3 with the plurality of the fastening members 5, respectively, the rear housing segment 3 is brought to cover on the back plate 4 (as shown in FIG. 4), such that the coupling column 523 of each of the fastening members 5 is inserted between the first stop block 322 and the second stop block 326 of the corresponding protruding post 32, the partition portion 324 of the first stop block 322 is engaged in the engaging passage 54, and the screw hole 525 in the locking column portion 524 is aligned with the through hole 323 of the corresponding one of the protruding posts 32. The engagement of the partition portion 324 of the first stop block 322 in the engaging passage 54 prevents the pulling plate 533 (shown in FIG. 5) from being pulled to move towards the coupling column 523, so that the engaging block 532 is securely engaged in the corresponding one of the engaging holes 21 in the board member 20.

Figure 16:
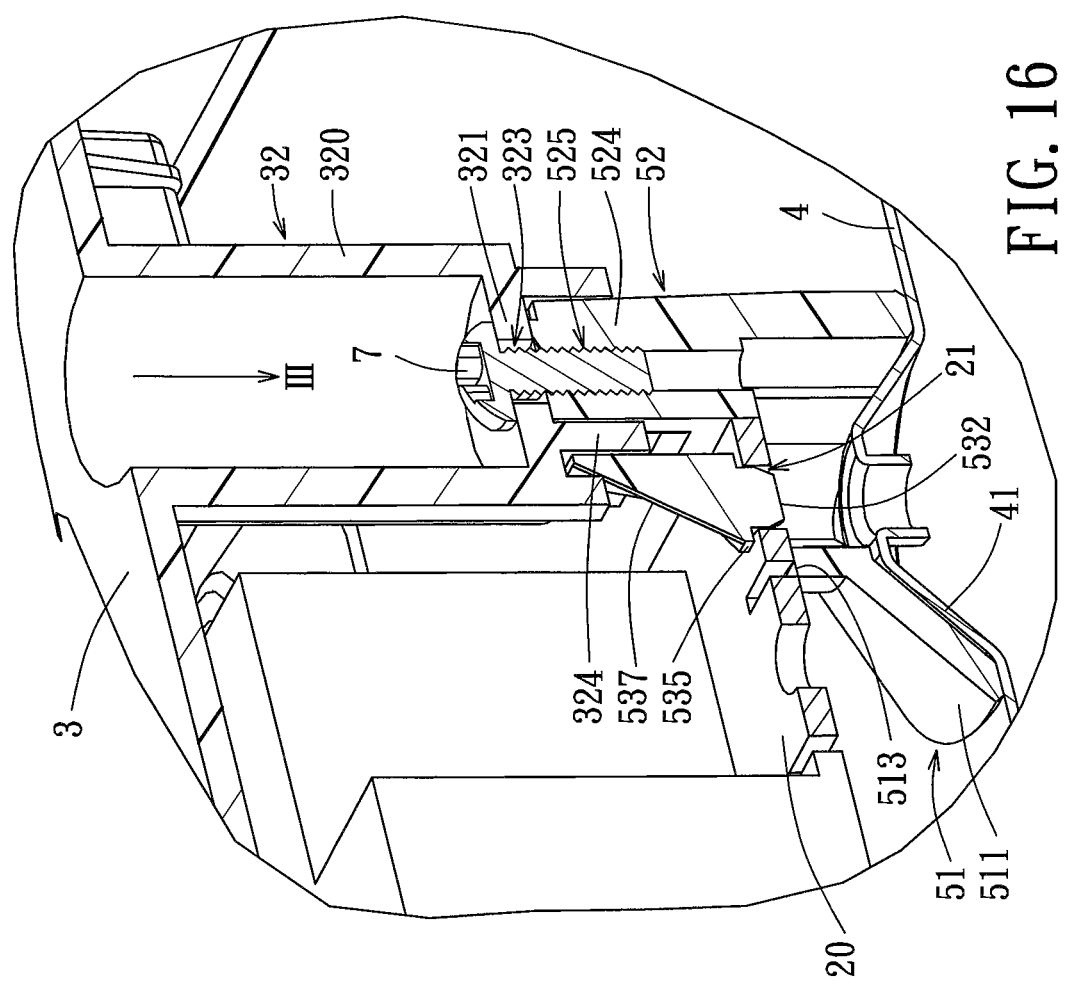
FIG. 16 is a partial enlarged view of FIG. 4, illustrating use of a screw fastener to secure the board member between the rear housing segment and the back plate.

Finally, the screw fasteners 7 are screwed in the screw holes 525 in the respective fastening members 5 through the through holes 323 in the respective protruding posts 32 in a direction indicated by arrow (III) as shown in FIG. 16 to complete the assembly process. Since the two first side portions 325 of the first stop block 322 respectively abut against the sides of the two first side ribs 526 facing the pulling plate 533 (as shown in FIG. 5), since the two second side portions 328 of the second stop block 326 respectively abut against the sides of the two first side ribs 526 opposite to the pulling plate 533, and since, meanwhile, the second side rib 527 of the coupling column 523 is engaged in the groove 329, the rotation of the fastening member 5 relative to the corresponding one of the protruding posts 32 is effectively restricted. Therefore, after passing through the through hole 323 in the corresponding one of the protruding posts 32, each of the screw fasteners 7 can be smoothly screwed into the screw hole 525 in the corresponding one of the fastening members 5 until the screw fastener 7 abuts against a rear wall surface of the end wall 321 opposite to the front wall surface, thereby fastening the corresponding one of the fastening members 5 to the corresponding one of the protruding posts 32 to allow the board member 20 to be secured between the back plate 4 and the rear housing segment 3.

On the other hand, when it is desired to remove the board member 20 from the back plate 4 and the rear housing segment 3, the screw fasteners 7 are first removed from the screw holes 525 in the fastening members 5. Next, the rear housing segment 3 is moved to separate the protruding posts 32 from the coupling columns 523 of the fastening members 5. Then, the board member 20 is removed from the back plate 4, bringing the cap bodies 511 of the fastening members 5 to uncover the protrusions 41 of the back plate 4. At this time, the assembly of the board member 20 and the fastening members 5 is removed from the back plate 4 and the rear housing segment 3. Thereafter, to remove each of the fastening members 5 from the board member 20, the pulling plate 533 of the engaging hook 53 is pulled in the direction indicated by the arrow (I) shown in FIG. 10, bringing the free end of the pulling plate 533 to approach the coupling column 523, so as to bring the engaging block 532 disengage from the corresponding one of the engaging holes 21 in the board member 20. Subsequently, the fastening member 5 is moved in the direction opposite to that indicated by the arrow (II) shown in FIG. 10 away from and relative to the board member 20, thereby completing the process of removing the fastening member 5 from the board member 20 to facilitate repair or replacement of the board member 20.

In summary, with the provision of the fastening members 5, the housing 30 of this embodiment facilitates fast and convenient assembly of the board member 20 between the back plate 4 and the rear housing segment 3, thus improving the assembly efficiency and reducing man hour. Moreover, the fastening members 5 are fastened to the board member 20 in an engaging and clamping manner, without adversely affecting or damaging the surface of the board member 20. Thus, the objects of the present invention can be achieved.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

The invention claimed is:

1. A housing for securing a board member that is formed with an engaging hole, comprising:
    a rear housing segment including a front surface and a protruding post that protrudes from said front surface;
    a back plate disposed in front of said rear housing segment, spaced apart from said front surface of said rear housing segment, and including a protrusion; and
    a fastening member disposed between said rear housing segment and said back plate and including a positioning cap covering removably said protrusion and having an outer surface opposite to said protrusion,
    a positioning post protruding from said outer surface of said positioning cap and engaged with said protruding post of said rear housing segment, and
    an engaging hook including a clamping plate that protrudes from said positioning post and that is spaced from said outer surface of said positioning cap, and an engaging block that protrudes from said clamping plate towards said outer surface of said positioning cap, said clamping plate and said positioning cap being operable to cooperatively clamp the board member there between, said engaging block being operable to removably engage in the engaging hole in the board member.

2. The housing of claim 1, wherein said engaging hook further includes a pulling plate protruding from one side of said clamping plate opposite to said engaging block, said pulling plate being spaced apart from said positioning post and being operable to bring said clamping plate to move towards said positioning post, so as to disengage said engaging block from the engaging hole in the board member.

3. The housing of claim 2, wherein said positioning post includes a stop column protruding from said outer surface of said positioning cap, said stop column including a stop surface for one side of the board member to abut there against.

4. The housing of claim 3, wherein said positioning cap includes a cap body covering removably said protrusion of said back plate and having said outer surface, and an abutting protrusion protruding from said outer surface towards said clamping plate, said abutting protrusion having an abutting surface that is parallel to and spaced apart from said clamping plate, said abutting surface and said clamping plate being operable to cooperatively clamp the board member there between.

5. The housing of claim 4, wherein said clamping plate includes two thick plate portions connected to said stop surface and spaced apart from each other, and a thin plate portion connected to ends of said two thick plate portions opposite to said stop surface, each of said thick plate portions having a thickness greater than that of said thin plate portion, said two thick plate portions cooperating to define a through slot therebetween, said pulling plate being perpendicularly connected at a junction of said two thick plate portions and said thin plate portion.

6. The housing of claim 5, wherein said engaging hook further includes a reinforcement plate connected between said pulling plate and said thin plate portion of said clamping plate.

7. The housing of claim 3, wherein said positioning post further includes a coupling column protruding from one end of said stop column distal from said positioning cap, said pulling plate and said coupling column cooperatively defining an engaging passage there between, said protruding post of said rear housing segment including an end wall and a first stop block that protrudes from said end wall and that is engaged in said engaging passage.

8. The housing of claim 7, wherein said end wall of said protruding post is formed with a through hole in spatial communication with the external environment, said coupling column of said positioning post being formed with a screw hole corresponding in position to said through hole, said housing further comprising a screw fastener passing through said through hole and threadedly engaged with said screw hole, said coupling column including two first side ribs that are respectively disposed on two opposite sides relative to said screw hole, said first stop block being U-shaped and including a partition portion that protrudes from said end wall and that is engaged in said engaging passage and two first side portions that protrude from said end wall and that are respectively disposed on two opposite ends of said partition portion, said two first side portions respectively abutting against sides of said two first side ribs that face said pulling plate.

9. The housing of claim 8, wherein said protruding post further includes a second stop block protruding from said end wall, said second stop block including a surrounding portion that is configured to surround an outer periphery of said coupling column and two second side portions that are respectively disposed on two opposite ends of said surrounding portion, said surrounding portion being formed with a groove, said coupling column further including a second side rib engaged in said groove, said two second side portions respectively abutting against sides of said two first side ribs that are opposite to said pulling plate.

10. A display device, comprising:
    a display module;
    a board member formed with a plurality of engaging holes; and
    a housing including a rear housing segment including a front surface and a plurality of protruding posts that protrude from said front surface,
    a back plate disposed at the rear of said display module and in front of said rear housing segment, spaced apart from said front surface, and including a plurality of protrusions, and
    a plurality of fastening members, disposed between said rear housing segment and said back plate, each of said fastening members including a positioning cap, a positioning post and an engaging hook, said positioning cap covering removably a corresponding one of said protrusions and having an outer surface opposite to the corresponding one of said protrusions, said positioning post protruding from said outer surface of said positioning cap and being engaged with a corresponding one of said protruding posts, said engaging hook including a clamping plate that protrudes from said positioning post and that is spaced apart from said outer surface of said positioning cap, and an engaging block that protrudes from said clamping plate towards said outer surface of said positioning cap, said clamping plate and said positioning cap being operable to cooperate to clamp said board member therebetween, said engaging block being removably engaged in a corresponding one of said engaging holes in said board member.

11. The display device of claim 10, wherein said engaging hook further includes a pulling plate protruding from one side of said clamping plate opposite to said engaging block, said pulling plate being spaced apart from said positioning post and being operable to bring said clamping plate to move towards said positioning post so as to disengage said engaging block from said the corresponding one of said engaging holes.

12. The display device of claim 11, wherein said positioning post includes a stop column protruding from said outer surface of said positioning cap, said stop column including a stop surface for one side of said board member to abut there against.

13. The display device of claim 12, wherein said positioning cap includes a cap body covering removably the corresponding one of said protrusions and having said outer surface, and an abutting protrusion protruding from said outer surface towards said clamping plate, said abutting protrusion having an abutting surface that is parallel to and spaced apart from said clamping plate, said abutting surface and said clamping plate cooperatively clamp said board member there between.

14. The display device of claim 13, wherein said clamping plate includes two thick plate portions connected to said stop surface and spaced apart from each other, and a thin plate portion connected to ends of said two thick plate portions opposite to said stop surface, each of said thick plate portions having a thickness greater than that of said thin plate portion, said two thick plate portions cooperating to define a through slot there between, said pulling plate being perpendicularly connected at a junction of said two thick plate portions and said thin plate portion.

15. The display device of claim 14, wherein said engaging hook further includes a reinforcement plate connected between said pulling plate and said thin plate portion of said clamping plate.

16. The display device of claim 12, wherein said positioning post further includes a coupling column protruding from one end of said stop column distal from said positioning cap, said pulling plate and said coupling column cooperatively defining an engaging passage there between, each of said protruding posts including an end wall and a first stop block that protrudes from said end wall that is engaged in said engaging passage.

17. The display device of claim 16, wherein said end wall of each of said protruding posts is formed with a through hole in spatial communication with the external environment, said coupling column of said positioning post of each of said fastening members being formed with a screw hole corresponding in position to said through hole in the corresponding one of said protruding posts, said housing further comprising a plurality of screw fasteners, each of the screw fasteners passing through said through hole in a corresponding one of said protruding posts and being threadedly engaged with said screw hole of said coupling column of a corresponding one of said fastening members, said coupling column including two first side ribs that are respectively disposed on two opposite sides relative to said screw hole, said first stop block being U-shaped and including a partition portion that protrudes from said end wall and that is engaged in said engaging passage and two first side portions that protrude from said end wall and that are respectively disposed on two opposite ends of said partition portion, said two first side portions respectively abutting against sides of said two first side ribs that face said pulling plate.

18. The display device of claim 17, wherein:
each of said protruding posts further includes a second stop block protruding from said end wall; and
said second stop block includes a surrounding portion that is configured to surround an outer periphery of said coupling column, and two second side portions that are respectively disposed on two opposite ends of said surrounding portion, said surrounding portion being formed with a groove, said coupling column of each of said fastening members further including a second side rib engaged in said groove in the corresponding one of said protruding posts, said two second side blocks respectively abutting against sides of said two first side ribs that are opposite to said pulling plate.

19. A fastening member adapted to secure a board member between a rear housing segment and a back plate that is disposed behind a display module, the board member being formed with an engaging hole, the rear housing segment including a protruding post, the back plate including a protrusion, said fastening member comprising:
a positioning cap including a cap body that is operable to cover the protrusion and that has an outer surface opposite to the protrusion, and an abutting protrusion that is formed on said outer surface of said cap body and that is configured for the board member to abut there against;
a positioning post including a stop column that protrudes from said outer surface of said cap body and that is operable to abut against one side of the board member, and a coupling column that protrudes from one end of said stop column distal from said cap body, said coupling column being operable to be engaged with the protruding post; and
an engaging hook including a clamping plate that protrudes from said stop column and that is spaced apart from said abutting protrusion, and an engaging block that protrudes from said clamping plate towards said outer surface of said positioning cap, said clamping plate and said abutting protrusion being operable to cooperatively clamp the board member there between, said engaging block being operable to be removably engaged in the engaging hole.

20. The fastening member of claim 19, wherein said engaging hook further includes a pulling plate protruding from one side of said clamping plate opposite to said engaging block, said pulling plate being spaced apart from said positioning post and being operable to bring said clamping plate to move towards said positioning post so as to disengage said engaging block from the engaging hole, said stop column including a stop surface operable to abut against the one side of the board member, said clamping plate including two thick plate portions that are connected to said stop surface and that are spaced apart from each other, and a thin plate portion that is connected to ends of said two thick plate portions opposite to said stop surface, each of said thick plate portions having a thickness greater than that of said thin plate portion, said two thick plate portions cooperatively defining a through slot there between, said pulling plate being perpendicularly connected at a junction of said two thick plate portions and said thin plate portion, said engaging hook further including a reinforcement plate that is connected between said pulling plate and said thin plate portion.

* * * * *